(12) United States Patent
Lall

(10) Patent No.: US 6,683,477 B1
(45) Date of Patent: Jan. 27, 2004

(54) MEMORY CELL

(75) Inventor: Ravindar M. Lall, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/207,292

(22) Filed: Jul. 29, 2002

Related U.S. Application Data

(62) Division of application No. 09/704,487, filed on Nov. 2, 2000, now Pat. No. 6,507,212.

(51) Int. Cl.$^7$ ................................................ H03K 19/20
(52) U.S. Cl. .................... 326/121; 326/83; 365/185.01; 365/189.05
(58) Field of Search ............................. 326/82, 83, 86, 326/93, 95, 112, 119, 121; 365/185.01, 189.05

(56) References Cited

U.S. PATENT DOCUMENTS

| | | | |
|---|---|---|---|
| 4,124,899 A | 11/1978 | Birkner et al. | 364/716 |
| 4,649,296 A | 3/1987 | Shoji | 307/451 |
| 4,706,216 A | 11/1987 | Carter | 365/94 |
| 4,829,203 A | 5/1989 | Ashmore, Jr. | 365/185.1 |
| 4,862,019 A | 8/1989 | Ashmore, Jr. | 365/185.1 |
| 4,866,307 A | 9/1989 | Ashmore, Jr. | 365/185.17 |
| 4,885,719 A | 12/1989 | Brahmbhatt | 365/185.17 |
| 4,924,278 A | 5/1990 | Logie | 257/318 |
| 5,148,391 A | 9/1992 | Zagar | 365/96 |
| 5,220,215 A | 6/1993 | Douglas et al. | 307/465 |
| 5,270,587 A | 12/1993 | Zagar | 307/469 |
| 5,646,547 A | 7/1997 | Goetting | 326/46 |
| 5,801,548 A | 9/1998 | Lee et al. | 326/44 |
| 6,028,789 A | 2/2000 | Mehta et al. | 365/185.14 |
| 6,489,806 B1 | 12/2002 | Mehta et al. | |

*Primary Examiner*—Don Le
(74) *Attorney, Agent, or Firm*—MacPherson Kwok Chen & Heid LLP

(57) ABSTRACT

A wide input programmable logic system includes a plurality of logic gates that receive a plurality of row driver signals and memory cell outputs to generate a plurality of logical NOR or NAND outputs for their respective one of said row driver signals and memory cell outputs that are programmed. At least one additional stage of logic gates having a plurality of logical NAND or NOR gates receive the respective logical NOR or NAND outputs and generate a plurality of respective logical NAND or NOR outputs. At least one respective logical NOR or NAND gate receives the respective plurality of logical NAND or NOR outputs and generates an output term. The memory cell may include an electrically erasable non-volatile memory cell having a storage cell that stores a logical value and a select transistor coupled to the storage cell. The select transistor is controlled by a first control signal, with the select transistor isolating the storage cell during editing upon receipt of an asserted state of the first control signal. A latch is coupled to the select transistor and controlled by a latch control signal to provide an output corresponding to the logical value stored in the storage cell. Respective timing of the first control signal and the latch control signal results in zero power dissipated by the electrically erasable non-volatile memory cell.

10 Claims, 8 Drawing Sheets

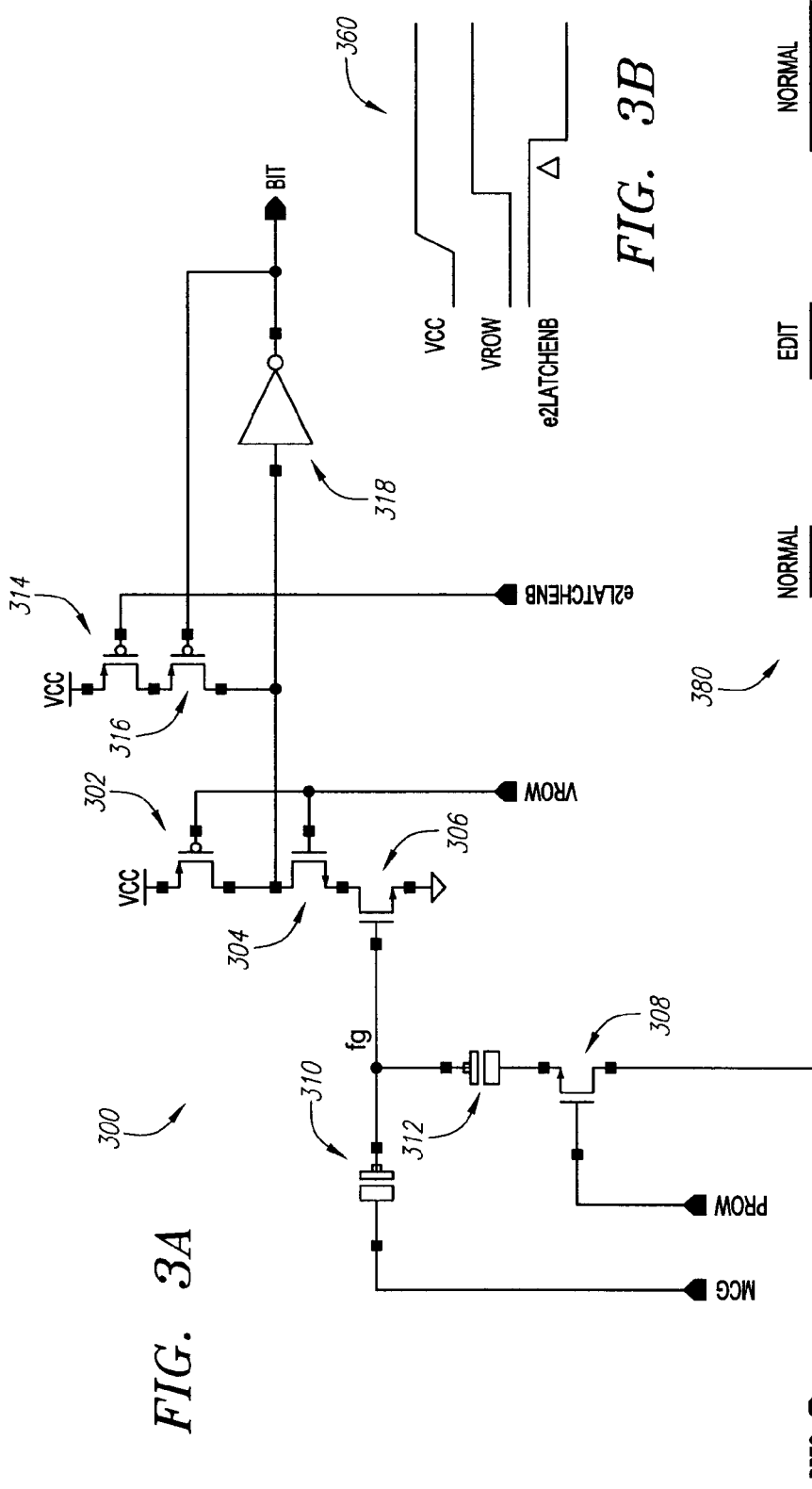
FIG. 3A
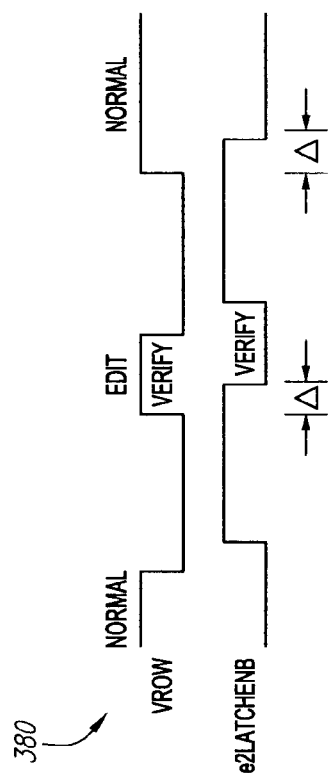
FIG. 3B
FIG. 3C

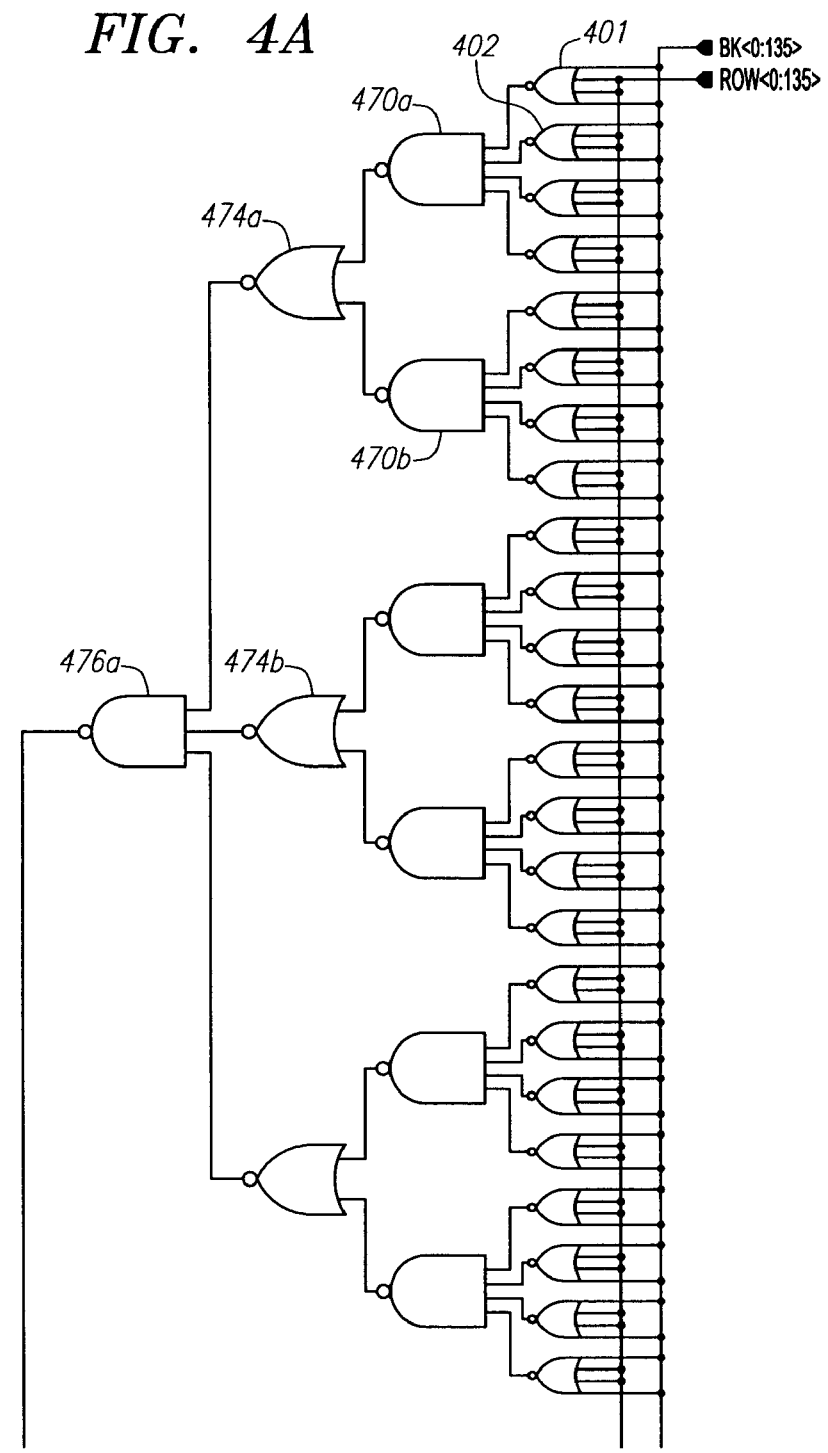

MEMORY CELL

This application is a divisional of application Ser. No. 09/704,487, filed on Nov. 2, 2000, now issued as U.S. Pat. No. 6,507,212 on Jan. 14, 2003.

BACKGROUND OF THE INVENTION

1. Field of the Invention

The present invention relates generally to electrical circuits and, more particularly, to programmable logic circuits and methods.

2. Related Art

Programmable logic devices (PLDs) are well known in the electronic art and are commonly used to implement Boolean logic functions. There exists a wide variety of PLD techniques including programmable logic arrays (PLAs), programmable array logic (PAL), field programmable logic arrays (FPLAs), and electrically erasable programmable logic devices (EEPLDs), to name but a few.

Traditionally, PLDs have used sense amplifiers (e.g., to sense the data in a memory matrix) to provide the output signals of programmable logic operations (e.g., a logical AND operation) of many inputs. For semiconductor processes of 0.25 $\mu$m and 2.5 V, the sense amplifier generally provided the best solution, at the cost of requiring additional power, because the ring oscillator speeds were relatively slow, the pertinent design rules were lax, and sufficient space existed for the sense amplifiers. However, integrated circuit technology and semiconductor processing have continued to make significant advances. For example, the operating characteristics, such as lower power consumption, superior voltage and current attributes, and scaling have improved. In a sense amplifier, however, it is difficult to scale the sense transistor, because of reliability concerns. The speed of the sense amplifier has shown little improvement over time also. Furthermore, the power requirements of the sense amplifier have become significant relative to other components.

BRIEF SUMMARY OF THE INVENTION

The programmable logic systems and methods of the present invention provide increased speed and lower power dissipation, while providing a size that scales with semiconductor processing requirements. In accordance with an embodiment of the present invention, the wide input programmable logic system utilizes complementary metal-oxide semiconductor (CMOS) gates to provide the output signals. In accordance with another embodiment of the present invention, an electrically erasable programmable non-volatile memory cell is disclosed that provides a zero-power memory cell, achieved through certain signal timing and pre-charging.

In accordance with an embodiment of the present invention, a wide-input programmable logic system includes a plurality of complex CMOS logic gates that perform a logical sequence including at least one of a NOR-NAND and a NAND-NOR to generate a final output term, which is a product of the inputs (e.g., row driver signals).

In accordance with another embodiment of the present invention, an electrically erasable non-volatile memory cell is provided that includes a storage cell that stores a logical value and a select transistor coupled to the storage cell. The select transistor is controlled by a first control signal, with the select transistor isolating the storage cell during editing upon receipt of an asserted state of the first control signal. A latch is coupled to the select transistor and controlled by a latch control signal to provide an output corresponding to the logical value stored in the storage cell. Respective timing of the first control signal and the latch control signal results in zero power dissipated by the electrically erasable non-volatile memory cell.

A more complete understanding of the wide input programmable logic systems and methods will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 3a is a schematic circuit of an electrically erasable programmable non-volatile memory cell in accordance with an embodiment of the present invention.

FIG. 3b shows a timing diagram illustrating signal timing for input signals in accordance with an embodiment of the present invention.

FIG. 3c shows a timing diagram illustrating signal timing for input signals and modes in accordance with an embodiment of the present invention.

FIG. 4, 4A, 4B and 4C disclose a digital logic circuit diagram in accordance with an embodiment of the present invention.

DETAILED DESCRIPTION OF THE INVENTION

Figure 1:
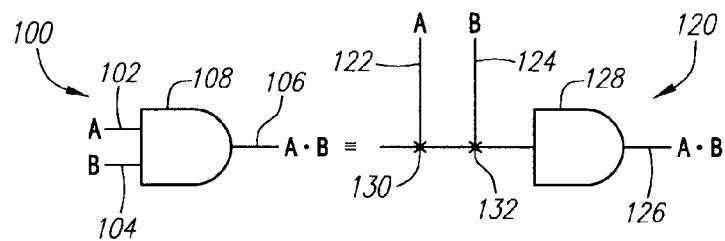
FIG. 1 is an illustration of digital logic circuitry in accordance with an embodiment of the present invention.

FIG. 1 illustrates a digital logic circuit 100 and its equivalent digital logic circuit 120, in programmable array logic (PAL) symbology, for two inputs. As is known in the art, digital logic circuit 100 represents a logical AND operation for two input signals, A 102 and B 104, into an AND gate 108. The result of the Boolean logic operation is the product term, A·B 106, at the output of AND gate 108. Digital logic circuit 120 represents the equivalent representation of digital logic circuit 100, but in PAL symbology. The two input signals, A 122 and B 124, each pass through corresponding intact fuses 130, 132, respectively, and a gate 128, to produce a product term A·B 126. Intact fuses 130, 132 may be situated on the logic or memory cell and perform the Boolean logic AND function for corresponding input signals A 122 and B 124, respectively.

For the product term A·B and in one embodiment of the present invention, to make the logical AND function programmable with non-volatile cells, DeMorgan's theorem is applied and the result gated with transistors that are driven by the output of the non-volatile cell. As an example, product term A·B is equal to ((A·B)')' which is equal to (A'+B')' which is equal to (A'·cell A+B'·cell B)' where "'" indicates the complement and cell A and cell B represent output signals from non-volatile memory cells. This result, (A'·cell A+B'·cell B)', may be written as (Row A·SelRow A+Row B·SelRow B)' where Row A and Row B are inverted output signals of a row driver that assist in performing the DeMorgan operation described above to obtain the sum of products in a PLD (e.g., (A·B+C·D)' is equivalent to ((A'+B')'+(C'+D')')'). SelRow A and SelRow B represent the outputs of corresponding non-volatile memory cells.

Figure 2:
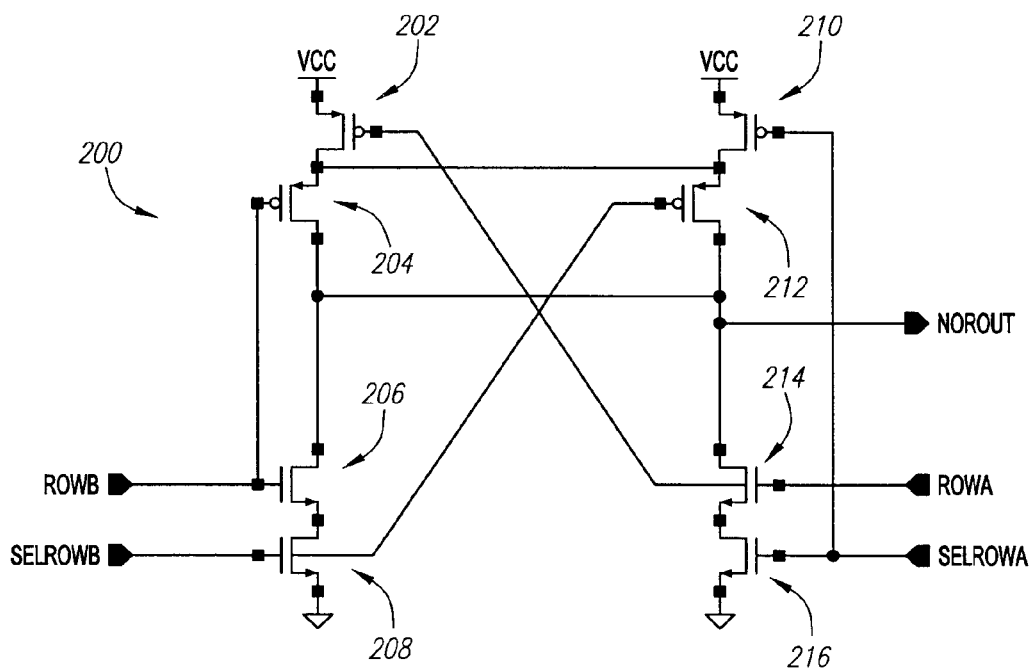
FIG. 2 is a schematic circuit of a complex CMOS gate in accordance with an embodiment of the present invention.

FIG. 2 shows a complementary metal-oxide semiconductor (CMOS) gate 200 in accordance with an embodiment of the present invention that implements certain aspects of the concepts discussed above. CMOS gate 200 (also referred to herein as "cmpxand") includes eight transistors, which perform a logical NOR function to provide output signal "norout" for the logic values of input signals rowa, rowb, selrowa, and selrowb. Input signals rowa and rowb are the output signals of a row driver. Input signals selrowa and selrowb, which determine whether input signals rowa and rowb are to be inverted, are the output signals of memory cells, including an electrically erasable ("E$^2$") programmable non-volatile memory cell (also referred to as an E$^2$ cell) described in detail below and illustrated in FIG. 3a.

Referring to FIG. 2, input signal rowa controls gate terminals of an n-type transistor 214 and a p-type transistor 202. Similarly, input signal rowb controls gate terminals of an n-type transistor 206 and a p-type transistor 204. Input signal selrowa controls gate terminals of n-type transistor 216 and p-type transistor 210. Similarly, input signal selrowb controls gate terminals of n-type transistor 208 and p-type transistor 212. A supply voltage Vcc is connected to source terminals of transistors 202, 210, while transistors 208, 216 have their source terminals connected to ground. The drain terminal of transistor 202 is connected to the source terminal of transistor 204 whose drain terminal is connected to the drain terminal of transistor 206. Similarly, the drain terminal of transistor 210 is connected to the source terminal of transistor 212 whose drain terminal is connected to the drain terminal of transistor 214. The source terminal of transistors 206, 214 are connected to the drain terminal of transistors 208, 216, respectively. Output signal norout controls the drain terminal of transistor 214, which is also connected to the drain terminal of transistor 206. The drain terminals of transistors 202, 210 are also connected together.

In operation, CMOS gate 200 performs a logical NOR operation as shown in Table 1 below, when input signals rowa and rowb are output signals of the same row driver of a memory cell and are complements of each other (although they do not have to be complements of each other). The X value in Table 1 represents a "do not care" condition. The values for input signals rowa, rowb are inverted from JEDEC (joint electronic device engineering council) standards to perform the DeMorgan equivalent (i.e., logical AND equals logical Invert-NOR). As can be seen in Table 1, CMOS gate 200 performs a logical operation on input signals rowa and rowb based upon whether input signal selrowa or selrowb is asserted. For example, if input signal selrowa is at a logical high value (i.e., 1) and input signal selrowb is at a logical low value (i.e., 0), then the inverted value of input signal rowa is provided at output signal norout. Similarly, if input signal selrowb is at a logical high value and input signal selrowa is at a logical low value, then the inverted value of input signal rowb is provided at output signal norout.

TABLE 1

Logical NOR Operation for FIG. 2

| Selrowa | selrowb | rowa | rowb | norout |
| --- | --- | --- | --- | --- |
| 0 | 0 | X | X | 1 |
| 1 | 0 | 1/0 | X | 0/1 |
| 0 | 1 | X | 1/0 | 0/1 |
| 1 | 1 | 1/0 | 0/1 | 0 |

As an example of the circuit operation, if input signal selrowa is at a low voltage level (e.g., 0 V or logical 0), input signal selrowb is at a logical high voltage level (e.g., 2 V or logical 1), and input signal rowb is at a logical high voltage level, then transistors 204, 212, and 216 are switched off and transistors 206 and 208 are switched on, so that output signal norout goes to a logical low level, as shown in Table 1. A similar analysis can be shown for the remaining values in the table. Essentially, if input signal selrowa is at a logical high level (e.g., as described below, a memory cell is programmed and provides a high signal level as input signal selrowa) and input signal selrowb is at a logical low level, which prevents a path to ground for output signal norout, then the voltage level of input signal rowa will determine the value of output signal norout. Likewise, if input signal selrowb is programmed and input signal selrowa is not, then input signal rowb will determine the value of output signal norout. When input signals selrowa, selrowb are both at a high signal level (i.e., both of the corresponding memory cells are programmed in a bulk program mode), output signal norout is at a logical low level. If input signals selrowa, selrowb are both at a low signal level (i.e., both of the corresponding memory cells are erased in a bulk erase mode), output signal norout is at a logical high level.

FIG. 3a is a schematic circuit of an E$^2$ programmable non-volatile memory cell (E$^2$ cell) 300 in one embodiment of the present invention. E$^2$ cell 300 is a zero-power memory cell, which is achieved through signal timing and pre-charging methods, described in greater detail below in reference to FIGS. 3b and 3c. As noted above, input signals selrowa and selrowb are each provided by an E$^2$ cell 300. E$^2$ cell 300 includes a p-type transistor 302 having a source terminal coupled to a supply voltage Vcc and a drain terminal coupled to a drain terminal of an n-type transistor 304 whose source terminal is coupled to a drain terminal of an n-type transistor 306 whose source terminal is coupled to a ground reference voltage. An input selection signal vrow (i.e., a verify row input signal) is coupled to the gate terminal of transistors 302, 304 and serves to isolate a portion of E$^2$ cell 300 from the sensing circuit and its sensing current by turning off transistor 304 when editing, such as a programming or an erasing operation, is being performed. Input signal vrow switches on transistor 304 during normal operation.

The drain terminals of transistors 302, 304 are coupled to a drain terminal of p-type transistor 316 and to input terminal of an inverter 318 at node pt1. The output signal of inverter 318 is an output signal bit for E$^2$ cell 300, with the output signal also coupled to the gate terminal of transistor 316. Output signal "bit" is provided as an input signal, such as input signal selrowa, for CMOS gate 200. The source of transistor 316 is coupled to a drain terminal of a p-type transistor 314, whose source terminal is coupled to supply voltage Vcc and whose gate terminal is coupled to an input signal "Latch enable" (e2latchenb or also referred to as "$E^2$ latch enable bar"). Input signal Latch enable goes low after all vrow signals have gone high to maintain a stable output signal bit.

Transistor 306 has its gate terminal coupled to an input selection signal mcg (matrix control gate) via a capacitor 310, with signal mcg used to erase $E^2$ cell 300. In normal operation, signal mcg is approximately at a bias voltage level. The gate terminal of transistor 306 is also coupled through a diode 312 to a source terminal of an n-type transistor 308, whose gate terminal is coupled to an input signal prow (program row) that is used to select one of a row of $E^2$ cells 300 to be programmed. The drain terminal of transistor 308 is coupled to an input signal pptg (program product term ground), which is used to select and program $E^2$ cell 300. The combination of input signals pptg, prow, and mcg determine which $E^2$ cell 300 in a memory cell array is selected for editing (i.e., programming or erasing). Table 2 below tabulates the various input selection signals and exemplary input values, along with intermediate and output values of $E^2$ cell 300, for various modes of operation.

In a typical erase operation for $E^2$ cell 300, a high voltage Vpp (e.g., 13–15 V) is applied at input signal mcg with input signal pptg set at 0 V and input signal prow set at Vcc (e.g., 5 V), which erases $E^2$ cell 300 and results in a negative voltage at node fg (floating gate). Transistor 306 is switched off and does not conduct or provide node pt1 a path to ground. To program $E^2$ cell 300, input signal mcg is set at 0 V and input signals pptg and prow are set at a high voltage level (e.g., 13–15 V), which results in a positive voltage at node fg and transistor 306 switched on. In normal operation with $E^2$ cell 300 programmed, node fg is at a positive voltage level, transistor 302 is in an off state, node pt1 is at ground potential, and output signal bit is at a high voltage level (i.e., high logical level). If $E^2$ cell 300 is erased, there is no path to ground through transistor 306 and transistors 314, 316 keep node pt1 at a high voltage level (e.g., Vcc voltage level), which forces output signal bit to remain at a low logical level.

TABLE 2

$E^2$ cell 300 Exemplary Input Values

| Mode | mcg | Prow | Pptg | pt1 | Latch Enable | vrow | bit |
|---|---|---|---|---|---|---|---|
| Normal | bias | Vcc | Bias | 0/1 | 0 | Vcc | 1/0 |
| Program | 0 | Vpp+/Vcc | Vpp/Vcc | Vcc | Vcc | 0 | 0 |
| Erase | Vpp | Vcc | 0 | Vcc | Vcc | 0 | 0 |
| Verify | bias | Vcc | Bias | 0/1 | 0/Vcc | Vcc/0 | 1/0 |
| Others | bias | Vcc | Bias | Vcc | Vcc | 0 | 0 |

FIGS. 3b and 3c show respective timing diagram 360 and timing diagram 380 illustrating signal timing for input signals to $E^2$ cell 300 in accordance with an embodiment of the present invention. As described above, $E^2$ cell 300 receives input signals mcg, pptg, prow, vrow, e2latchenb, and Vcc and generates output signal bit. Timing diagrams 360, 380 include exemplary waveforms for various signals including Vcc, vrow, and e2latchenb and are provided to facilitate an understanding of the timing associated with $E^2$ cell 300.

$E^2$ cell 300 is a zero-power memory cell that prevents current from flowing through transistors 302, 304, and 306 (shown in FIG. 3a) during editing modes, such as when programming or erasing $E^2$ cell 300, by utilizing a transistor configuration and a latch (i.e., half-latch) along with certain signal timing and pre-charging methods. Specifically, when editing $E^2$ cell 300, input signal vrow goes low, which switches on transistor 302 (i.e., a pre-charge transistor) and switches off transistor 304 resulting in node pt1 pre-charging to a voltage level of approximately Vcc. $E^2$ cell 300 is then edited, as described above, which causes node fg to become negative or positive depending upon whether $E^2$ cell 300 is erased (i.e., programmed with a zero value) or programmed with a positive value, respectively. During this programming or editing operation, no current flows from Vcc through transistors 302, 304, and 306, because transistor 304 is switched off due to input signal vrow at 0 V.

As shown in FIG. 3b, upon application of voltage Vcc, input signal vrow rises to a logical high level followed, after a certain time "delta", by input signal e2latchenb (referred to herein also as Latch enable) dropping to a logical low level. Input signal e2latchenb drops to a logical low level after all vrow signals have risen to a high logic level to maintain good signal quality at the output. Input signal vrow transitioning from a low to a high logic level switches off transistor 302 and switches on transistor 304. Node pt1 during the edit mode has been pre-charged to a voltage level of approximately Vcc due to transistor 302 being switched on and transistors 304, 314 being switched off.

If the $E^2$ cell 300 is programmed with a positive value, then node fg is at a positive value and transistor 306 (i.e., a sense transistor) is switched on. When input signal vrow goes to a high logic level, transistor 304 is switched on and a path to ground through transistors 304, 306 results in node pt1 being pulled to a logical low level. Inverter 318 inverts the logical low to a logical high level at output signal bit, which switches transistor 316 off. Input signal e2latchenb then transitions to a logical low value, which switches on transistor 314, but no current flows due to transistor 316 being switched off.

If the $E^2$ cell 300 is programmed with a logical low value (i.e., the cell is erased), then node fg is at a zero or negative value and transistor 306 is switched off. When input signal vrow transitions to a high logical value and transistor 304 is switched on and transistor 302 is switched off, node pt1 remains pre-charged to approximately a voltage level of Vcc due to the pre-charge from transistor 302 and there being no path to ground because transistor 306 is switched off. To prevent node pt1 from eventually discharging due to leakage, a latch (i.e., a half-latch) comprised of transistors 314, 316 and inverter 318 maintains the charge on node pt1. After input signal vrow transitions to a high logical value, input signal e2latchenb transitions from a high to a low logical value. Transistor 314 switches on and the low logical value at the output signal bit feeds back to keep transistor 316 switched on such that node pt1 maintains a logical high value through transistors 314, 316.

Timing diagram 380 illustrates the timing between input signals vrow and e2latchenb during operational mode changes. As shown in FIG. 3c, during normal mode input signal vrow is at a logical high value and input signal e2latchenb is at a logical low value. Upon transition to edit mode, input signal vrow transitions to a logical low value and then, after a short time delay, input signal e2latchenb transitions to a logical high value. This procedure switches off transistor 304 (i.e., a select transistor) to isolate a portion of $E^2$ cell 300 from the storage portion of $E^2$ cell 300 that consists of transistor 306 (i.e., sense transistor), transistor 308 (i.e., programming row select transistor), capacitor 310, and diode 312. After editing, input signal vrow transitions to a high logical value followed, after a certain time delta, by input signal e2latchenb transitioning to a low logical value.

Thus, transistor 314 is switched on by input signal e2latchenb after transistor 304 is switched by input signal vrow. The editing may be verified, as shown in FIG. 3c, prior to returning to normal mode. As can be seen, input signal vrow transitions prior to input signal e2latchenb for each mode change. Consequently, $E^2$ cell 300 is a zero-power memory cell, which prevents current flow through transistors 302, 304, and 306 during normal and programming or editing operations.

Figure 4B:
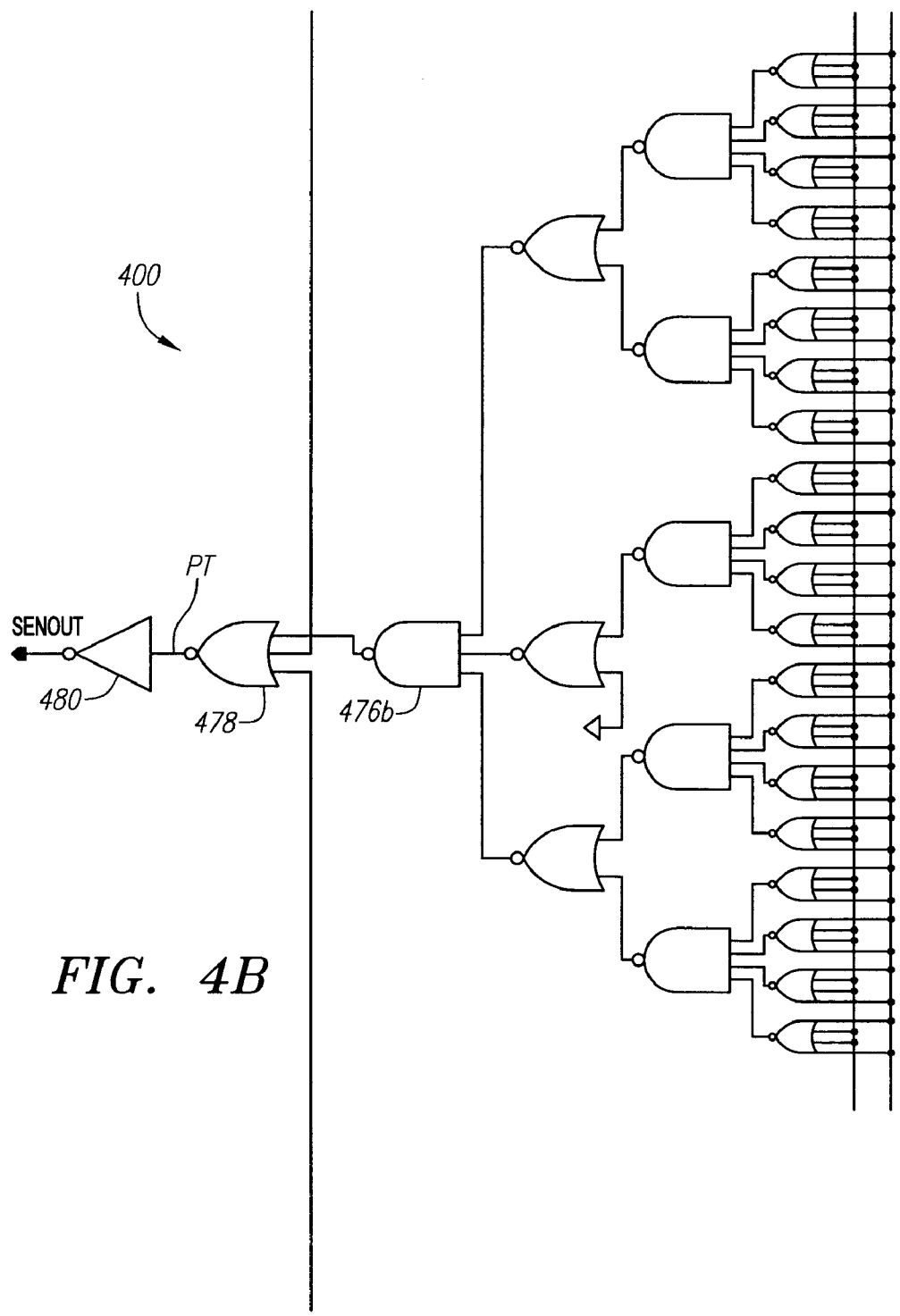
Figure 4C:
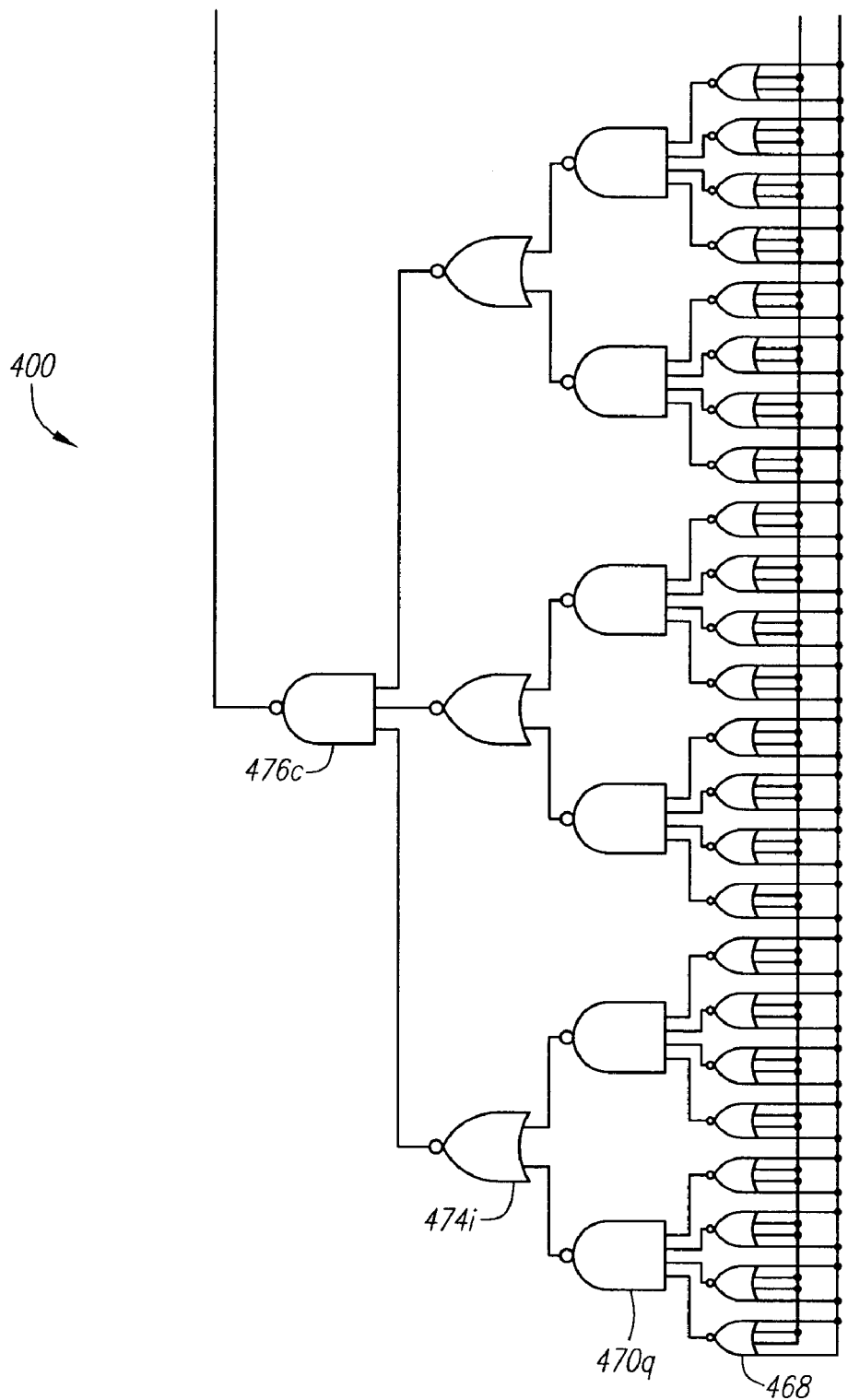

FIG. 4 is a digital logic circuit 400 in accordance with an embodiment of the present invention. Logic circuit 400 performs a logical function for 136 bit signals and 136 row signals over 5 levels or tiers of logic gates. The 136 bit signals and the 136 row signals, with half of the row signals being complements of the other half of the row signals, are respective input signals to a first level of 68 four-input NOR gates 401–468, whose output signals are respectively input signals to a second level of 17 four-input NAND gates 470a–470q, whose output signals are respective inputs to a third level of 9 two-input NOR gates 474a–474i, whose output signals are respectively input signals to a fourth level of 3 three-input NAND gates 476a–476c, whose output signals are the input signals to a fifth level of one three-input NOR gate 478, whose output signal provides the value of the product term (PT). PT is a complex product term of 136 inputs, generated from a logical OR function performed over five levels, with PT being the logical NOR of all programmed inputs to the logical array. A final inverter 480 at the output of NOR gate 478 may be included to improve the drive strength of the PT signal, with the final output signal senout being supplied.

Specifically, bit signal 0 and bit signal 1, which are outputs of $E^2$ cell 300, along with row signal 0 and row signal 1, which are row selection signals that are complements of each other, are input signals to NOR gate 401. Bit signal 2, bit signal 3, row signal 2, and row signal 3 are input signals to NOR gate 402. Similar arrangements are provided for NOR gates to receive bit and row signals, such as NOR gate 468, which receives bit signals 134, 135 and row signals 134 and 135. NOR gates 401 through 468 may be each substituted by CMOS gate 200. NAND gate 470a receives the outputs of NOR gates 401–404, NAND gate 470b receives the outputs of NOR gates 405–408, and similar arrangements are provided for NAND gates to receive output signals of NOR gates, such as NAND gate 470q, which receives the output signals of NOR gates 465–468. NOR gate 474a receives the output signals of NAND gates 470a, 470b, NOR gate 474b receives the outputs of NAND gates 470c, 470d, and similarly, to NOR gate 474i that receives the output signals of NAND gates 470p, 470q. NAND gate 476a receives the output signals of NOR gates 474a, 474b, and 474c, NAND gate 476b receives the output signals of NOR gates 474d, 474e, 474f, and NAND gate 476c receives the output signals of NOR gates 474g, 474h, and 474i. Finally, NOR gate 478 receives the output signals of NAND gates 476a, 476b, and 476c, with the output signal of NOR gate 478 being the output signal for the logical function or product term.

Figure 5:
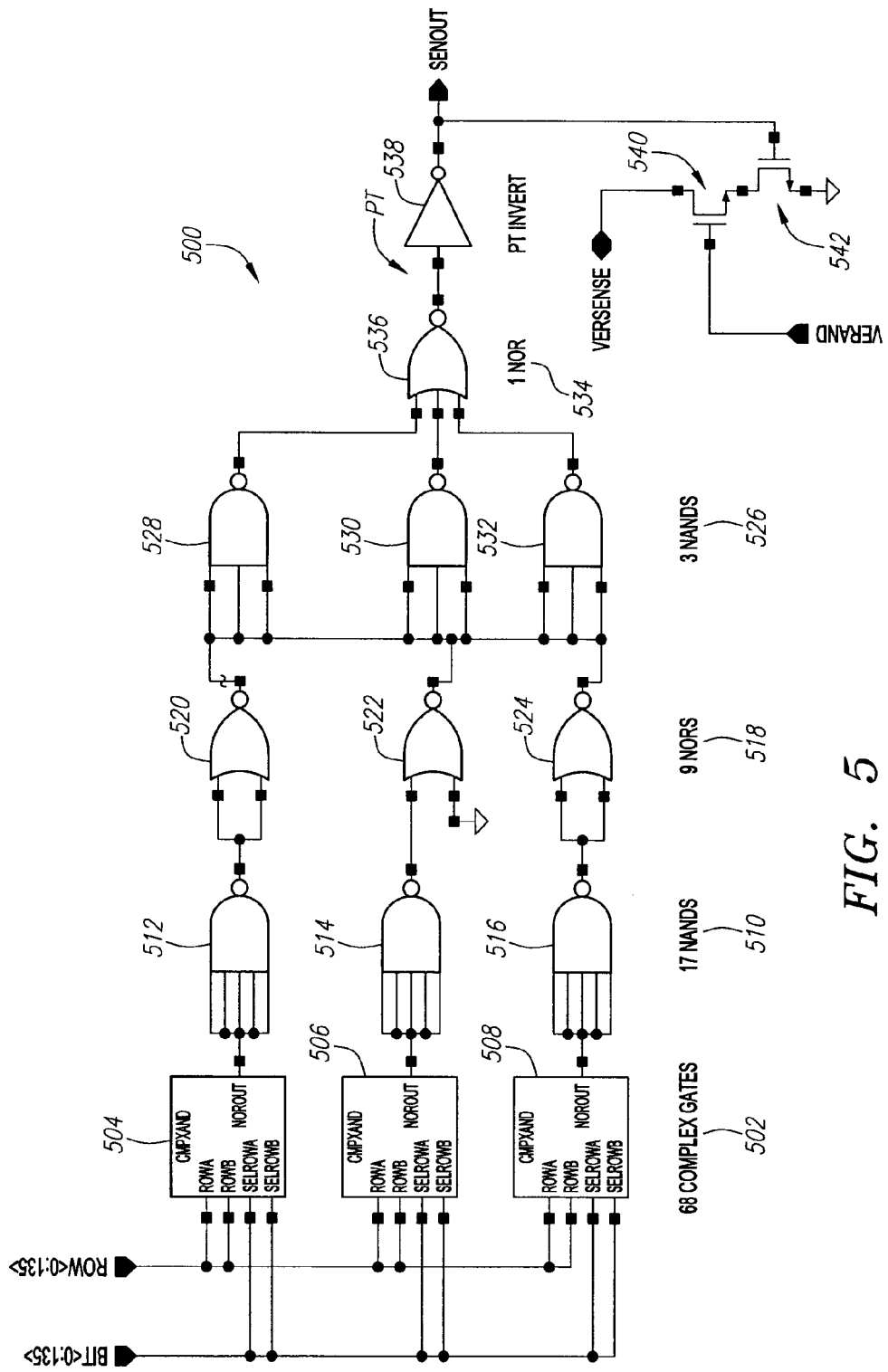
FIG. 5 is a block diagram of a digital logic circuit diagram in accordance with an embodiment of the present invention.

FIG. 5 is a block diagram of a digital logic circuit 500 in accordance with an embodiment of the present invention. Logic circuit 500 is a block diagram corresponding to FIG. 4, described in detail above. The 136 bit signals and the 136 row signals are input signals to level one gates 502, which includes 68 complex gates (i.e., 68 cmpxand circuits), each of which is described in detail above in reference to FIG. 2, grouped into logical blocks 504, 506, and 508. Logical block 504 represents 32 complex gates, each performing a logical NOR function for respective input signals rowa, rowb, selrowa, and selrowb. Logical block 506 represents 4 complex gates and logical block 508 represents 32 complex gates, for a total of 68 complex gates. Each complex gate receives its respective bit signals indicated by signals selrowa and selrowb and its respective row signals indicated by signals rowa and rowb.

The output signals of level one gates 502 enter level two gates 510, which consists of 17 NAND gates, grouped into logical blocks 512, 514, and 516. Logical block 512 represents 8 NAND gates, each performing its logical function on the respective input signals from level one 502. Logical block 514 represents 1 NAND gate and logical block 516 represents 8 NAND gates, for a total of 17 NAND gates. The output signals of level two gates 510 enter level three 518, which consists of 9 NOR gates, comprising logical blocks 520, 522, and 524. Logical block 520 represents 4 NOR gates, each performing its logical function on the respective input signals from level two 510. Similarly, logical block 522 represents 1 NOR gate and logical block 524 represents 4 NOR gates. The output signals of level three gates 518 enter level four gates 526, which consists of 3 NAND gates 528, 530, and 532, which perform their logical function on their respective signals and provide their outputs to level five gates 534. Level five gates 534 includes one NOR gate 536, which performs its logical function on the output signals of NAND gates 528, 530, and 532 and outputs the result or product term PT signal.

PT signal may be inverted for drive strength reasons by inverter 538 to produce output signal senout. PT signal is the logical NOR of all programmed input signals to the logical array such that any programmed row high signal will force PT signal low. The inversion from PT signal to output signal senout may be used in conjunction with a following NAND gate to form a logical OR function (i.e., invert NAND is DeMorgan equivalent of logical OR).

Output signal senout may be coupled to the gate terminal of an n-type transistor 542, whose source terminal is coupled to ground and whose drain terminal is coupled to the source of an n-type transistor 540. Transistor 540 has its gate coupled to an input signal verand and its drain coupled to signal versense. Transistors 540, 542 are used to verify the state of each memory cell, one at a time. For example, in a special mode, the memory cells are selected one memory cell at a time, with the output signal senout monitored to determine whether the selected memory cell is programmed or erased. If the memory cell is programmed, output signal senout is at a high logical level, which switches on transistor 542 resulting in signal versense to drop to a logical low. If the memory cell is not programmed (i.e., erased), output signal senout is at a low logical level, which switches transistor 542 off and forces signal versense to remain at a high voltage level, verifying that the selected cell is erased.

Figure 6:
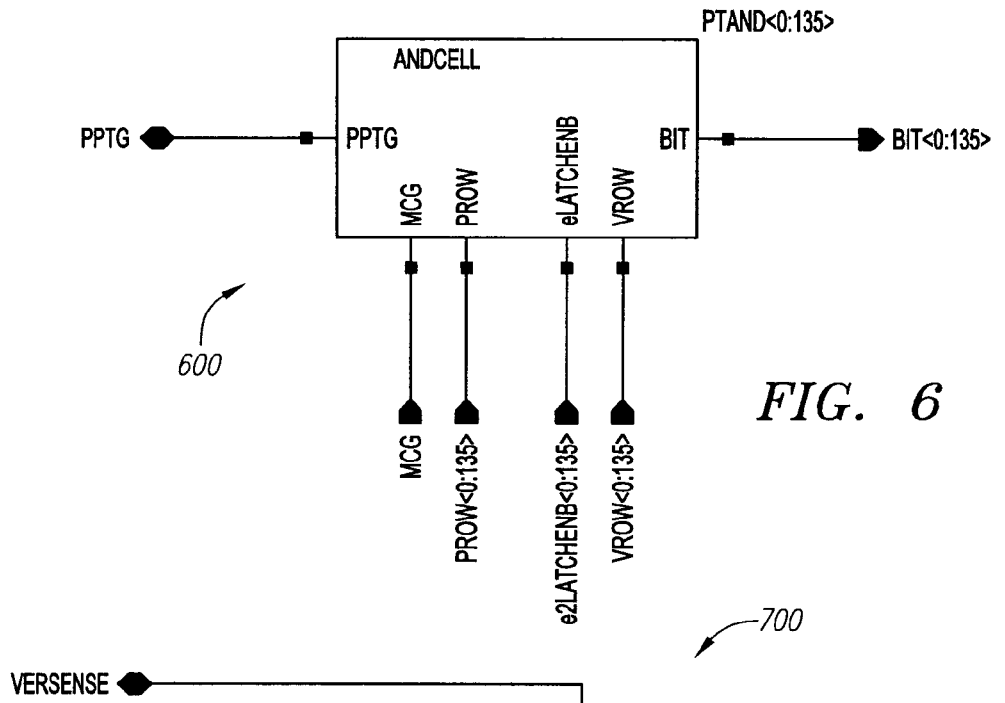
FIG. 6 is a block diagram showing the input and output signals for a number of electrically erasable programmable non-volatile memory cells in accordance with an embodiment of the present invention.
Figure 7:
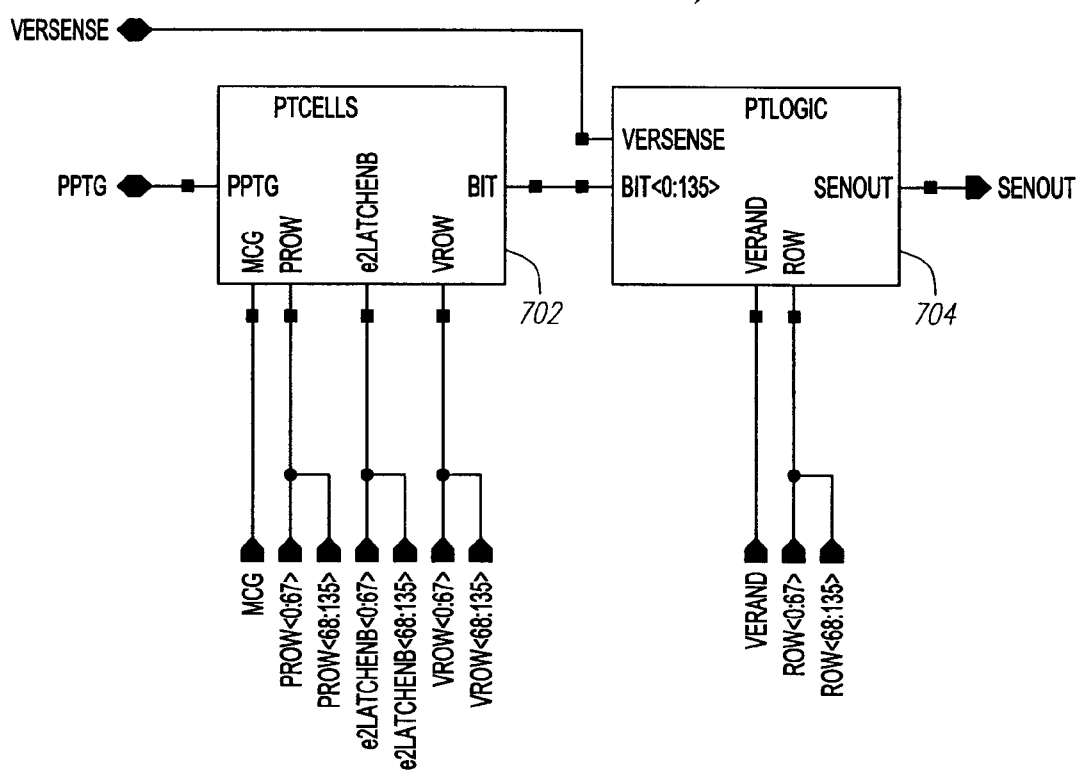
FIG. 7 is a block diagram showing the input and output signals for a digital logic circuit in accordance with an embodiment of the present invention.
Figure 8:
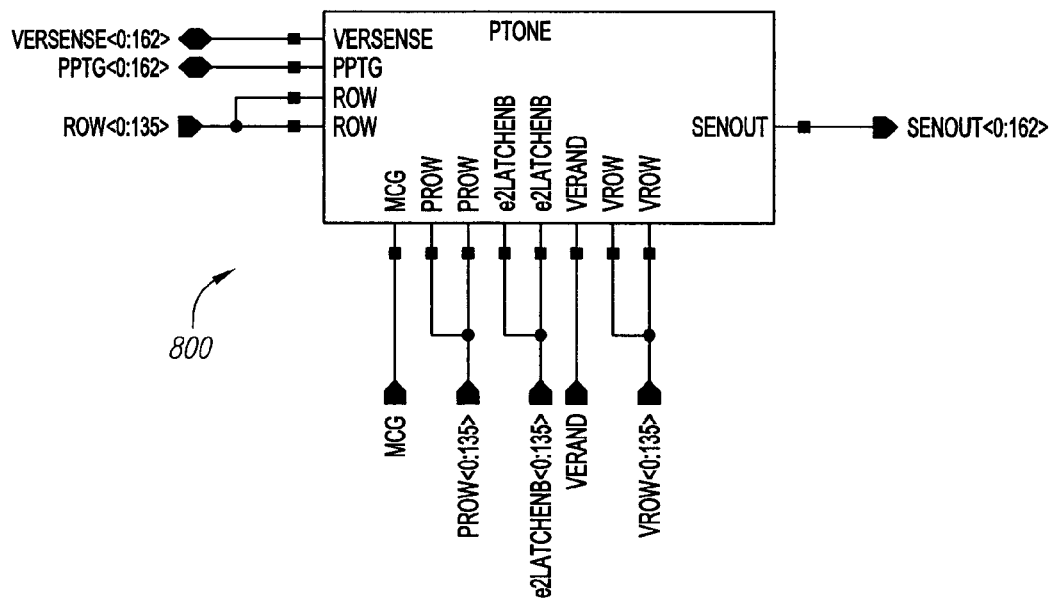
FIG. 8 shows a single block with the input and output signals for a digital logic circuit in accordance with an embodiment of the present invention.

FIGS. 6–8 show various block diagram configurations in accordance with certain embodiments of the present invention. FIG. 6 is a block diagram showing the input and output signals for a number bf electrically erasable programmable non-volatile memory cells 600 in accordance with an embodiment of the present invention. $E^2$ cells 600 receive input signals pptg, mcg, prow, vrow, and e2latchenb and provide output signal bit. For example, $E^2$ cell 600 may include 136 $E^2$ cells with a corresponding number of input and output signals.

FIG. 7 is a block diagram showing the input and output signals for a digital logic circuit 700 in accordance with an embodiment of the present invention. Logic circuit 700 includes two functional blocks, a functional memory block 702 and a functional logic block 704. Memory block 702 receives input signals mcg, prow, e2latchenb, vrow, and pptg and provides output signal bit. For example, memory block 702 includes 136 memory cells, such as $E^2$ cells, with certain signals broken up into groups from 0–67 and from 68–135. Memory block 702 may be viewed as an alternative block diagram representation to $E^2$ cell 600 (described in reference to FIG. 6). Logic block 704 receives output signal bit along with signals versense, verand, and row and provides output signal senout. For example, logic block 704 may be viewed as an exemplary block diagram representation of logic circuit 500 (described in detail in reference to FIG. 5). In general, logic circuit 700, with memory block 702 and logic block 704, generates one product term (i.e., senout) from 136 input signals (i.e., vrow signals).

FIG. 8 shows a single block with the input and output signals for a digital logic circuit 800 in accordance with an embodiment of the present invention. Logic circuit 800 includes memory cells and performs logical functions within a single block. Logic circuit 800 receives input signals versense, pptg, row, mcg, prow, e2latchenb, verand, and vrow and provides output signals senout. In general, logic circuit 800 is arraying the one product term (e.g., senout as described in reference to FIG. 7) 163 times to build an "AND" array of 136 vrow input signals and 163 senout output signals (i.e., product terms). Furthermore, logic circuit 800 may be implemented for any number of inputs and outputs, besides the exemplary 136 by 163 "AND" array and is applicable for wide or narrow input signal (i.e., many or few input signal) applications.

The NOR-NAND-NOR-NAND summing of partial product terms, as described above, to achieve a final product term may also be implemented, in accordance with an embodiment of the present invention, as a NAND-NOR-NAND-NOR function. Furthermore, the levels of logic gates required depend upon the number of input signals provided. In general, the width of each NAND or NOR CMOS gate may also be adjusted, with either a greater or lesser number of input signals, as desired and optimized for certain characteristics, such as speed. For example, the complex gates and various logic gates, such as described in reference to FIG. 5, may have any number of inputs. Also the "AND" array illustrated in FIG. 5, may have more than one product term output. The sub-product terms are available to generate, for example, two 68 input "AND" output terms along with the 136 input "AND" output term. This procedure can be extended to finer sub-product terms or input "AND" output terms within the array.

In accordance with an embodiment of the present invention, a programmable OR plane may also be constructed utilizing the techniques described above. Furthermore, in addition to the exemplary embodiments above, the present invention is applicable to various other applications such as in a programmable read only memory (PROM) data path to address or decode or in a static random access memory (SRAM) data path. Also, for example, SRAM cells can be substituted for the non-volatile memory cells above. Other types of memory cells may also be substituted for the exemplary memory devices described in the embodiments herein.

Figure 9:
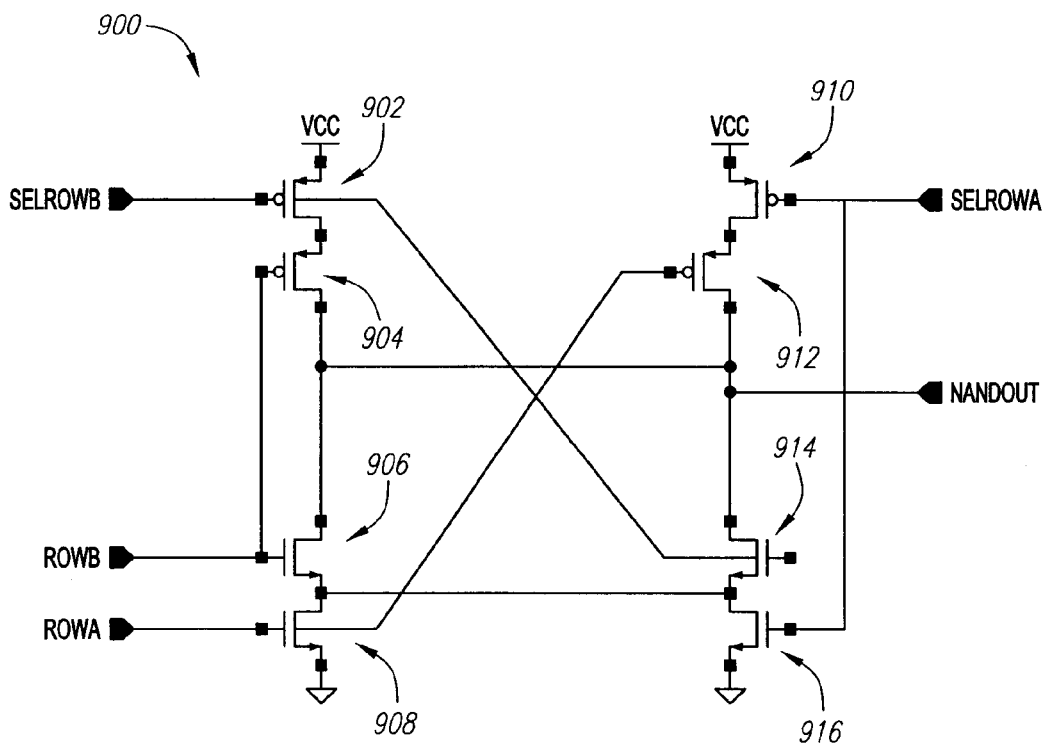
FIG. 9 is a schematic circuit of a complex CMOS gate in accordance with an embodiment of the present invention.

If the output signal polarity is opposite that disclosed above for $E^2$ cell 300 or, for example, if both output signal polarities are available (e.g., SRAM memory cell providing both output signal polarities), then a complementary circuit to CMOS gate 200 (i.e., cmpxand circuit) may be provided, referred to herein as a "cmpxor" circuit. FIG. 9 is a schematic circuit of a complex CMOS gate 900 providing an exemplary circuit implementation of a "cmpxor" circuit in accordance with an embodiment of the present invention.

CMOS gate 900 includes eight transistors, which perform a logical NAND function to provide output signal "nandout" for the logic values of input signals rowa, rowb, selrowa, and selrowb. Input signals rowa and rowb are the output signals of a row driver while input signals selrowa and selrowb, which determine whether input signals rowa and rowb are to be inverted, are the output signals of memory cells.

Input signal rowa controls gate terminals of an n-type transistor 908 and a p-type transistor 912. Similarly, input signal rowb controls gate terminals of an n-type transistor 906 and a p-type transistor 904. Input signal selrowa controls gate terminals of a p-type transistor 910 and an n-type transistor 916. Similarly, input signal selrowb controls gate terminals of a p-type transistor 902 and an n-type transistor 914. A supply voltage Vcc is connected to source terminals of transistors 902 and 910, while transistors 908 and 916 have their source terminals connected to ground. The drain terminal of transistor 902 is connected to the source terminal of transistor 904 whose drain terminal is connected to the drain terminal of transistor 906. Similarly, the drain terminal of transistor 910 is connected to the source terminal of transistor 912 whose drain terminal is connected to the drain terminal of transistor 914. The source terminal of transistors 906 and 914 are connected to each other and also to the drain terminal of transistors 908 and 916. Output signal nandout is connected to the drain terminal of transistors 914 and 906, whose drain terminals are also connected.

In operation, CMOS gate 900 performs a logical NAND operation as shown in Table 3 below, when input signals rowa and row are output signals of the same row driver of a memory cell. As can be seen in Table 3, CMOS gate 900 performs a logical operation on input signals rowa and rowb based upon whether input signal selrowa or selrowb is asserted.

TABLE 3

| Logical NAND Operation for FIG. 9 | | | | |
|---|---|---|---|---|
| Selrowa | selrowb | rowa | rowb | nandout |
| 0 | 0 | 1/0 | 0/1 | 1 |
| 1 | 0 | X | 1/0 | 0/1 |
| 0 | 1 | 1/0 | X | 0/1 |
| 1 | 1 | X | X | 0 |

CMOS gate 900 can be used to build an "AND" array in a similar fashion as CMOS gate 200 was used, as described above, to build an "AND" array. The array performs a logical function for a number of input signals over a series of levels or tiers of logic gates. For example, a logic circuit can be designed using a first level of logic gates including CMOS gates 900 (i.e., cmpxor circuits), which receive bit and row signals and provide output signals that are input signals to NOR gates (i.e., a second level of logic gates). The NOR gate output signal are input signals to NAND gates (i.e., a third level of logic gates), which provide input signals to NOR gates (i.e., a fourth level of logic gates), which provide input signals to NAND gates (i.e., a fifth level of logic gates), which is followed by an inverter to generate the product term "PT."

The product term is generated from a logical AND function performed over a number of levels, based on the NAND-NOR pattern, in a similar fashion as described above in reference to FIG. 5 that generates the product term from a logical OR function, based on the NOR-NAND pattern. Consequently, the summing of partial product terms to achieve a final product term may be implemented as a NOR-NAND or NAND-NOR function, in accordance with embodiments of the present invention.

In comparison to a conventional sense amplifier approach, wide input programmable logic operations using, for example, complex CMOS gates offer, for example, speed advantages that scale with semiconductor processes, a reduction in direct current static power requirements, and lower supply voltage requirements. Additional advantages for programmable logic operations may include power requirements that scale with respect to the square of the supply voltage rather than with respect to the supply voltage; supply current requirements that scale with the supply voltage and semiconductor processes, with the supply current not dependent upon semiconductor process variations; minimal speed degradation over time; and minimal difference in speed between one and all of the input gates switching at a time. Furthermore, in accordance with an embodiment of the present invention, the system and method described herein reduces the requirements of a non-volatile cell because the cell size and current may be reduced along with the programming voltages and, consequently, cell margins and stresses are significantly decreased.

Embodiments described above illustrate but do not limit the present invention. It should also be understood that numerous modifications and variations are possible in accordance with the principles of the present invention. Accordingly, the scope of the invention is defined only by the following claims.

I claim:

1. An electrically erasable non-volatile memory cell comprising:
    a storage cell adaptable to store a logical value;
    a select transistor coupled to said storage cell and controlled by a first control signal, said select transistor isolates said storage cell during editing upon receipt of an asserted state of said first control signal; and
    a latch coupled to said select transistor and controlled by a latch control signal, said latch providing said logical value from said storage cell to an output terminal of said electrically erasable non-volatile memory cell, wherein respective timing of said first control signal and said latch control signal results in zero power dissipated by said electrically erasable non-volatile memory cell.

2. The memory cell of claim 1, wherein said latch comprises:
    an inverter whose input is coupled to said select transistor and whose output is coupled to said output terminal of said electrically erasable non-volatile memory cell;
    a first transistor coupled to a voltage source and to said latch control signal which controls said first transistor; and
    a second transistor coupled to said first transistor and to said input and said output of said inverter, wherein said second transistor maintains a certain logical level at said input of said inverter for a first logical state at said output of said inverter.

3. The memory cell of claim 1, further comprising:
    a pre-charge transistor coupled to a voltage source and to said select transistor and controlled by said first control signal; and
    wherein said asserted state of said first control signal allows said pre-charge transistor to provide a certain logical level at an input to said latch.

4. The memory cell of claim 1, wherein said storage cell further comprises:
    a sense transistor coupled to said select transistor;
    a diode coupled to said sense transistor;
    a capacitor having one end coupled to said sense transistor and another end coupled to a matrix control signal; and
    a program transistor coupled, through said diode, to said sense transistor and to said one end of said capacitor, said program transistor controlled by a row control signal and a program control signal, wherein said storage cell is programmed with certain logical values based upon asserted states of said row control signal, said program control signal, and said matrix control signal.

5. An electrically erasable non-volatile memory cell comprising:
    a storage cell adaptable to store a logical value and controlled by a matrix control signal, a row control signal, and a program control signal;
    a select transistor coupled to said storage cell and controlled by a first control signal, said select transistor isolates said storage cell during certain modes upon receipt of an asserted state of said first control signal;
    a pre-charge transistor coupled to a voltage source and to said select transistor and controlled by said first control signal; and
    a latch coupled to said select transistor and to said pre-charge transistor at a first node, said pre-charge transistor applying a certain logical value at said first node when said select transistor isolates said storage cell, said latch controlled by a latch control signal latches an output determined by said storage cell and provides said logical value at an output terminal of said electrically erasable non-volatile memory cell.

6. The memory cell of claim 5, wherein respective timing of said first control signal and said latch control signal results in zero power dissipated by said electrically erasable non-volatile memory cell.

7. The memory cell of claim 5, wherein said latch comprises:
    an inverter whose input is coupled to said select transistor and whose output is coupled to said output terminal of said electrically erasable non-volatile memory cell;
    a first transistor coupled to a voltage source and to said latch control signal; and
    a second transistor coupled to said first transistor and to said input and said output of said inverter, wherein said second transistor maintains a certain logical level at said input of said inverter for a first logical state at said output of said inverter.

8. A method of storing data in electrically erasable non-volatile memory cell comprising:
    providing in said electrically erasable non-volatile memory cell a non-volatile storage cell which stores a logical value based upon received programming control signals;
    providing a select transistor to isolate said storage cell from other portions of said electrically erasable non-volatile memory cell during editing upon receipt of an asserted state of a first control signal; and
    providing a latch coupled to said select transistor and controlled by a latch control signal, said latch providing an output for said electrically erasable non-volatile memory cell based upon said logical value stored in said storage cell, wherein respective timing of said first control signal and said latch control signal results in zero power dissipated by said electrically erasable non-volatile memory cell.

9. The method of claim 8, further comprising providing a pre-charge transistor coupled to said select transistor and controlled by said first control signal, wherein said asserted state of said first control signal allows said pre-charge transistor to provide a certain logical level at an input to said latch.

10. The method of claim 8, further comprising providing a change in state of said first control signal prior to providing a change in state of said latch control signal.

* * * * *